(12) United States Patent
Bian et al.

(10) Patent No.: US 11,788,180 B2
(45) Date of Patent: Oct. 17, 2023

(54) DISCONTINUOUS VACUUM-METALIZED THIN FILM AND WIRE AND METHOD FOR MANUFACTURING SAME

(71) Applicant: SHANGHAI GALAXY METALLIC YARN CO., LTD, Shanghai (CN)

(72) Inventors: Jianhua Bian, Shanghai (CN); Nishikawa Kasumi, Kyotanabe (JP)

(73) Assignee: SHANGHAI GALAXY METALLIC YARN CO., LTD, Shanghai (CN)

( * ) Notice: Subject to any disclaimer, the term of this patent is extended or adjusted under 35 U.S.C. 154(b) by 150 days.

(21) Appl. No.: 16/610,024

(22) PCT Filed: Jan. 29, 2019

(86) PCT No.: PCT/CN2019/073613
§ 371 (c)(1),
(2) Date: Oct. 31, 2019

(87) PCT Pub. No.: WO2019/120313
PCT Pub. Date: Jun. 27, 2019

(65) Prior Publication Data
US 2021/0071288 A1     Mar. 11, 2021

(30) Foreign Application Priority Data

Dec. 21, 2017   (CN) .......................... 201711395193.5

(51) Int. Cl.
*C23C 14/24*   (2006.01)
*C23C 14/20*   (2006.01)
(Continued)

(52) U.S. Cl.
CPC ........ *C23C 14/0005* (2013.01); *B32B 15/018* (2013.01); *B32B 15/20* (2013.01);
(Continued)

(58) Field of Classification Search
CPC ........ C23C 14/005; C23C 14/20; C23C 14/24
See application file for complete search history.

(56) References Cited

U.S. PATENT DOCUMENTS 7,156,945 B2 *  1/2007  Chaug ................... C23C 14/042
                                                   156/701
8,286,342 B2 * 10/2012  Blenkhorn ........... H05K 3/1275
                                                    29/874
(Continued)

FOREIGN PATENT DOCUMENTS

CN         1597333 A     3/2005
CN       103648968 A     3/2014
(Continued)

OTHER PUBLICATIONS

PubChem. Compound Summary Acetone. 2022. (Year: 2022).*
International Search Report (In English and Chinese) issued in PCT/CN2019/073613, dated Apr. 18, 2019; ISA/CN.

*Primary Examiner* — Dah-Wei D. Yuan
*Assistant Examiner* — Kristen A Dagenais
(74) *Attorney, Agent, or Firm* — Harness, Dickey & Pierce, P.L.C.

(57) ABSTRACT

A method for manufacturing a discontinuous vacuum-metalized thin film includes the following steps: step 1: coating a corona surface of a flexible thin film (1) with a longitudinal discontinuous stripping layer; step 2: coating the corona surface and the stripping layer with a metal layer (3); and step 3: removing the stripping layer and the metal layer (3) on the stripping layer to obtain a discontinuous vacuum-metalized thin film. A method for manufacturing a discontinuous vacuum-metalized wire, a discontinuous vacuum-metalized thin film and a discontinuous vacuum-metalized wire are further disclosed.

3 Claims, 4 Drawing Sheets

(51) Int. Cl.
   *C23C 14/04*    (2006.01)
   *C23C 14/00*    (2006.01)
   *B32B 15/01*    (2006.01)
   *B32B 15/20*    (2006.01)
   *C23C 14/58*    (2006.01)

(52) U.S. Cl.
   CPC .............. *C23C 14/20* (2013.01); *C23C 14/24* (2013.01); *C23C 14/584* (2013.01); *C23C 14/5873* (2013.01)

(56) References Cited

U.S. PATENT DOCUMENTS

| | | | |
|---|---|---|---|
| 8,529,784 B2* | 9/2013 | Cao | ........................ B82Y 30/00 252/2 |
| 8,821,740 B2 | 9/2014 | Lee et al. | |
| 9,695,499 B2 | 7/2017 | Lee et al. | |
| 2004/0112237 A1* | 6/2004 | Chaug | ..................... C23C 14/20 427/261 |
| 2008/0170982 A1* | 7/2008 | Zhang | ..................... D02G 3/44 423/447.3 |
| 2014/0112237 A1 | 4/2014 | Chen et al. | |
| 2014/0144881 A1 | 5/2014 | Lee et al. | |
| 2014/0335328 A1 | 11/2014 | Lee et al. | |

FOREIGN PATENT DOCUMENTS

| | | |
|---|---|---|
| CN | 104822249 A | 8/2015 |
| CN | 105403939 A | 3/2016 |
| CN | 105452519 A | 3/2016 |
| CN | 108118295 A | 6/2018 |
| JP | 2004002976 A | 1/2004 |

\* cited by examiner

DISCONTINUOUS VACUUM-METALIZED THIN FILM AND WIRE AND METHOD FOR MANUFACTURING SAME

CROSS REFERENCE TO RELATED APPLICATIONS

This application is a U.S. National Phase Application under 35 U.S.C. 371 of International Application No. PCT/CN2019/073613 filed on Jan. 29, 2019, which claims the benefit of priority from Chinese Patent Application No. 201711395193.5 filed Dec. 21, 2017. The entire disclosures of all of the above applications are incorporated herein by reference.

TECHNICAL FIELD

The present invention belongs to the field of materials, and particularly relates to a discontinuous vacuum-metalized thin film and wire and method for manufacturing the same.

BACKGROUND

A thin film formed by a continuous vacuum metallization on a PET or PA thin film is called a vacuum-metalized thin film, and the vacuum-metalized thin film is widely used in fields of packaging and gold and silver yarns and the like through different processing techniques.

The gold and silver yarns are a textile raw material. The gold and silver yarns are textile yarns formed by coating a vacuum-aluminized (silvered) thin film with a protective layer and then cutting the vacuum-aluminized (silvered) thin film into metal film fibers and then stranding the metal film fibers with other yarns, and are widely used for fabric weaving, sweaters, embroidery, and the like in the textile industry.

An ordinary vacuum-metalized thin film metal layer is continuous, and after the ordinary vacuum-metalized thin film metal layer is cut into a wire, the wire is a wire with a high resistance. After the wire is woven into a textile, the textile has a certain shielding effect due to the formation of a mesh structure.

At present, the ex-warehouse, storage and sales of textiles are gradually performed using a radio frequency identification technology and RFID. Since textiles woven from ordinary gold and silver yarns have a shielding effect on an electronic tag, the gold and silver yarn textiles cannot use the RFID for unmanned sales and rapid ex-warehouse and storage. Therefore, there is a need for a novel packaging outer layer material that does not hinder radio frequency identification technologies such as RFID.

SUMMARY

In order to overcome the problems in the prior art, the present invention provides a discontinuous vacuum-metalized thin film and wire and method for manufacturing the same. An objective of the present invention is to provide a novel packaging material that does not hinder a radio frequency identification technology, especially for the field of unmanned sales of gold and silver yarn fabrics by using RFID.

The present invention provides a method for manufacturing a discontinuous vacuum-metalized thin film, including the following steps:

step 1: coating a corona surface of a flexible thin film with a longitudinal discontinuous stripping layer; step 2: coating the corona surface and the stripping layer with a metal layer; and step 3: removing the stripping layer and the metal layer on the stripping layer to obtain a discontinuous vacuum-metalized thin film.

In a preferred technical solution of the present invention, the stripping layer is a water-soluble stripping layer or a fat-soluble stripping layer.

In a preferred technical solution of the present invention, in step 3, the stripping layer and the metal layer on the stripping layer are washed away with water or grease.

In a preferred technical solution of the present invention, the method for manufacturing a discontinuous vacuum-metalized thin film further includes step 4: coating the flexible thin film and a surface of the metal layer with a protective layer.

The present invention further provides a method for manufacturing a discontinuous vacuum-metalized wire, including the steps of the method for manufacturing a discontinuous vacuum-metalized thin film, and the method for manufacturing a discontinuous vacuum-metalized wire further includes step 5 after step 3 or step 4: longitudinally cutting the discontinuous vacuum-metalized thin film to obtain a discontinuous vacuum-metalized wire.

The present invention further provides a discontinuous vacuum-metalized thin film manufactured by using the method for manufacturing a discontinuous vacuum-metalized thin film. The discontinuous vacuum-metalized thin film has a continuous flexible thin film layer, and a corona surface of the flexible thin film layer is provided with a longitudinal discontinuous metal layer.

The present invention further provides a discontinuous vacuum-metalized thin film manufactured by using the method for manufacturing a discontinuous vacuum-metalized thin film. The discontinuous vacuum-metalized thin film has a continuous flexible thin film layer, a corona surface of the flexible thin film layer is provided with a longitudinal discontinuous metal layer, and the top sections of both the flexible thin film layer and the metal layer are covered with a protective layer.

The present invention further provides a discontinuous vacuum-metalized wire manufactured by using the method for manufacturing a discontinuous vacuum-metalized wire. The discontinuous vacuum-metalized wire has a continuous flexible wire layer, a corona surface of the flexible wire layer is provided with a longitudinal discontinuous metal layer, and the flexible wire layer and the metal layer are each provided with a protective layer.

In the discontinuous vacuum-metalized thin film or the discontinuous vacuum-metalized wire provided by the present invention, the flexible thin film layer or the flexible wire layer is a PET thin film or a PA thin film.

In the discontinuous vacuum-metalized thin film or the discontinuous vacuum-metalized wire, the metal layer is an aluminum layer or a silver layer.

The flexible thin film is often wound along a long side. For convenience of description, in the present specification, "longitudinal" refers to a direction in which the flexible thin film is wound; and "longitudinal discontinuous" refers to that the flexible thin film is coated with a stripping layer transversely (namely parallel to a short side of the flexible thin film).

Advantageous effects of the present invention compared to the prior art are as follows: when the discontinuous vacuum-metalized thin film according to the present invention is used for packaging, a shielding effect of the discontinuous vacuum-metalized thin film on a packaged object may be lost. When the discontinuous vacuum-metalized wire according to the present invention is used for textiles, a shielding effect of the discontinuous vacuum-metalized wire on an electronic tag may be lost. Gold and silver yarn textiles can be subjected to radio frequency identification in an unlimited number, making it possible to achieve quick ex-warehouse, storage and unmanned sales of the gold and silver yarn textiles, which greatly improves labor productivity and reduces labor costs.

BRIEF DESCRIPTION OF THE DRAWINGS

In FIGS. 1-7, 1. flexible thin film layer, 2. stripping layer, 3. metal layer, 4. protective layer, 5. flexible wire layer.

DETAILED DESCRIPTION OF EMBODIMENTS

A discontinuous vacuum-metalized thin film and wire and method for manufacturing the same provided by the present invention will be described in more detail below with reference to the schematic drawings, where preferred embodiments of the present invention are shown, and it should be understood that those skilled in the art can modify the present invention described herein while the advantageous effects of the present invention are still achieved. Therefore, the following description is to be understood to be widely known to those skilled in the art and is not intended to limit the present invention.

FIGS. 1 to 4 show a method for manufacturing a discontinuous vacuum-metalized thin film according to the present invention, including the following steps:

Step 1: coat a corona surface of a flexible thin film with a longitudinal discontinuous stripping layer.

Step 2: coat the corona surface and the stripping layer with a metal layer.

Step 3: remove the stripping layer and the metal layer on the stripping layer to obtain a discontinuous vacuum-metalized thin film.

In a preferred embodiment of the present invention, the stripping layer is a water-soluble stripping layer or a fat-soluble stripping layer.

In a preferred embodiment of the present invention, in step 3, the stripping layer and the metal layer on the stripping layer are washed away with water or grease.

Figure 1:
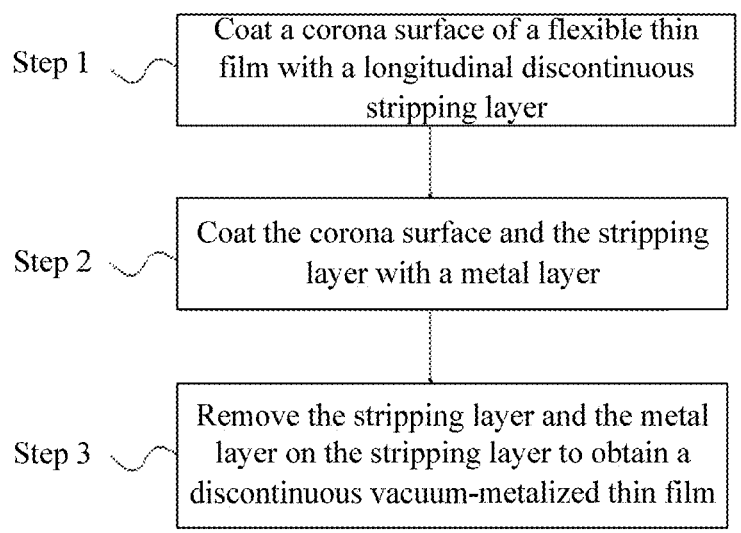
FIG. 1 is a flow chart of a method for manufacturing a discontinuous vacuum-metalized thin film according to a specific embodiment of the present invention.
Figure 2:
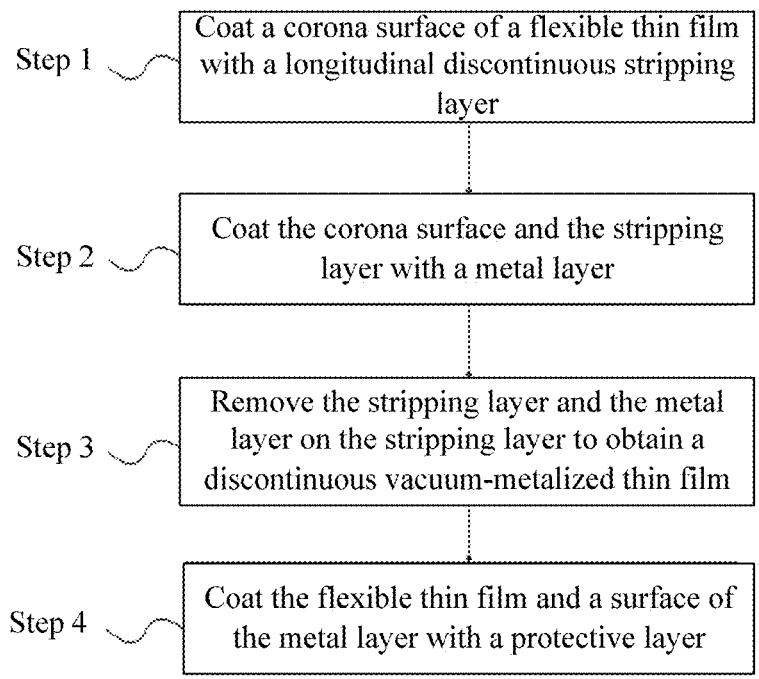
FIG. 2 is a flow chart of a method for manufacturing a discontinuous vacuum-metalized thin film according to another specific embodiment of the present invention.

In a preferred embodiment of the present invention as shown in FIG. 2, the method for manufacturing a discontinuous vacuum-metalized thin film further includes step 4: coating the flexible thin film and a surface of the metal layer with a protective layer.

Figure 3:
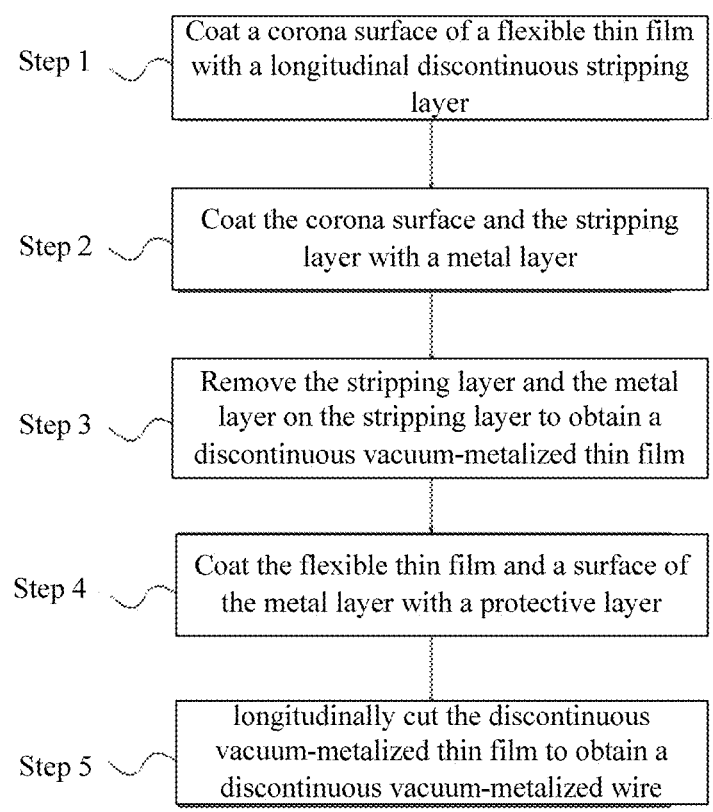
FIG. 3 is a flow chart of a method for manufacturing a discontinuous vacuum-metalized wire according to a specific embodiment of the present invention.

In a preferred embodiment of the present invention as shown in FIG. 3, the present invention further provides a method for manufacturing a discontinuous vacuum-metalized wire, including the steps of the method for manufacturing a discontinuous vacuum-metalized thin film, and the method for manufacturing a discontinuous vacuum-metalized wire further includes step 5 after step 3 or step 4: longitudinally cutting the discontinuous vacuum-metalized thin film to obtain a discontinuous vacuum-metalized wire.

Figure 4:
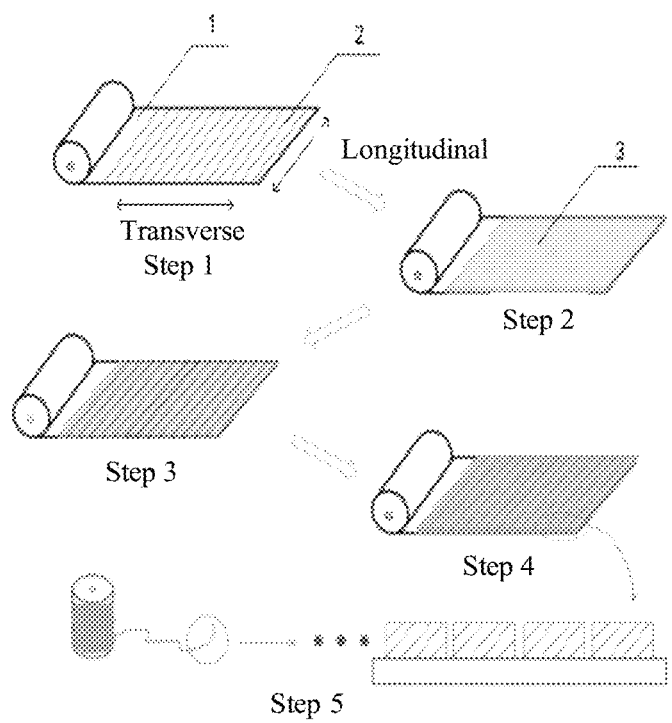
FIG. 4 is a schematic flow chart of a method for manufacturing a discontinuous vacuum-metalized thin film and a method for manufacturing a discontinuous vacuum-metalized wire according to a specific embodiment of the present invention.
Figure 5:
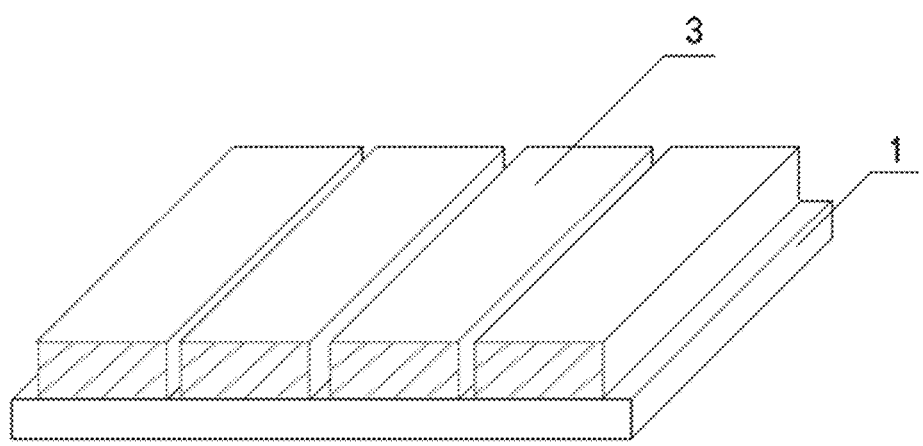
FIG. 5 is a schematic view of a discontinuous vacuum-metalized thin film according to a specific embodiment of the present invention.

FIG. 4 shows a discontinuous vacuum-metalized thin film manufactured in a specific embodiment of the present invention. The discontinuous vacuum-metalized thin film has a continuous flexible thin film layer 1, and a corona surface of the flexible thin film layer 1 is provided with a longitudinal discontinuous metal layer 3.

Figure 6:
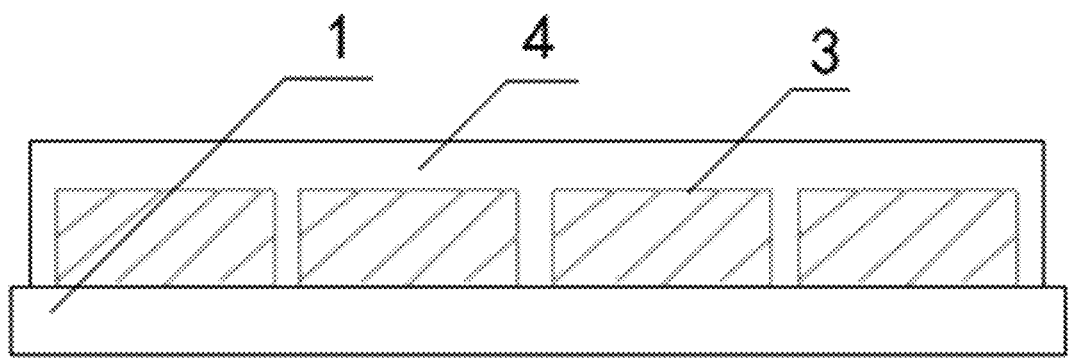
FIG. 6 is a cross-sectional view of a discontinuous vacuum-metalized thin film according to a specific embodiment of the present invention.

FIG. 6 shows a cross-sectional view of a discontinuous vacuum-metalized thin film manufactured in another embodiment of the present invention. The discontinuous vacuum-metalized thin film has a continuous flexible thin film layer 1, a corona surface of the flexible thin film layer 1 is provided with a longitudinal discontinuous metal layer 3, and the top sections of both the flexible thin film layer 1 and the metal layer 3 are covered with a protective layer 4.

Figure 7:
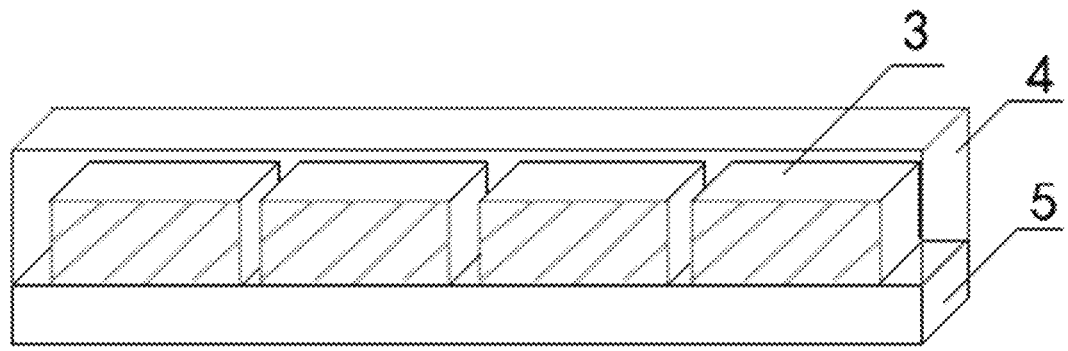
FIG. 7 is a schematic view of a discontinuous vacuum-metalized wire according to a specific embodiment of the present invention.

FIG. 7 shows a discontinuous vacuum-metalized wire manufactured by using the method for manufacturing a discontinuous vacuum-metalized wire according to the present invention. The discontinuous vacuum-metalized wire has a continuous flexible wire layer 5, a corona surface of the flexible wire layer 5 is provided with a longitudinal discontinuous metal layer 3, and the flexible wire layer 5 and the metal layer 3 are each provided with a protective layer 4.

In the discontinuous vacuum-metalized thin film or the discontinuous vacuum-metalized wire provided by the present invention, the flexible thin film layer 1 or the flexible wire layer 5 is a PET thin film or a PA thin film.

In the discontinuous vacuum-metalized thin film or the discontinuous vacuum-metalized wire, the metal layer 3 is an aluminum layer or a silver layer.

When the discontinuous vacuum-metalized thin film according to the present invention is used for packaging, a shielding effect of the discontinuous vacuum-metalized thin film on a packaged object may be lost. When the discontinuous vacuum-metalized wire according to the present invention is used for textiles, a shielding effect of the discontinuous vacuum-metalized wire on an electronic tag may be lost. Gold and silver yarn textiles can be subjected to radio frequency identification in an unlimited number, making it possible to achieve quick ex-warehouse, storage and unmanned sales of the gold and silver yarn textiles, which greatly improves labor productivity and reduces labor costs.

The above are merely preferred embodiments of the present invention, which do not impose any limitation on the present invention. Any form of equivalent replacement or modification and the like performed on the technical solutions and technical contents disclosed by the present invention by those skilled in the art without departing from the technical solutions of the present invention do not deviate from the technical solutions of the present invention and still fall within the protection scope of the present invention.

What is claimed is:

1. A method for manufacturing a gold and silver yarn, comprising
    step 1: coating a corona surface of a flexible thin film with a longitudinal discontinuous stripping layer;
    step 2: coating the corona surface and the stripping layer with a metal layer; and
    step 2: removing the stripping layer and the metal layer on the stripping layer to obtain a packaging material; and longitudinally cutting the packaging material to obtain the gold and silver yarn,
    wherein the stripping layer is a fat-soluble stripping layer.

2. The method for manufacturing a gold and silver yarn according to claim 1, wherein in step 3, the stripping layer and the metal layer on the stripping layer are washed away with grease.

3. The method for manufacturing a gold and silver yarn according to claim 1, further comprising the following step between step 3 and step 4: coating the flexible thin film and a surface of the metal layer with a protective layer.

\* \* \* \* \*